(12) United States Patent
Chae

(10) Patent No.: US 7,829,474 B2
(45) Date of Patent: Nov. 9, 2010

(54) METHOD FOR ARRAYING NANO MATERIAL AND METHOD FOR FABRICATING LIQUID CRYSTAL DISPLAY DEVICE USING THE SAME

(75) Inventor: Gee Sung Chae, Inchon-si (KR)

(73) Assignee: LG. Display Co., Ltd., Seoul (KR)

( * ) Notice: Subject to any disclaimer, the term of this patent is extended or adjusted under 35 U.S.C. 154(b) by 867 days.

(21) Appl. No.: 11/418,314

(22) Filed: May 4, 2006

(65) Prior Publication Data
US 2007/0026646 A1   Feb. 1, 2007

(30) Foreign Application Priority Data
Jul. 29, 2005   (KR) ............... 10-2005-0069622

(51) Int. Cl.
*H01L 21/31* (2006.01)
*H01L 21/469* (2006.01)

(52) U.S. Cl. ............... 438/780; 438/151; 438/479; 438/99; 257/E21.005; 257/E21.051; 257/E21.299

(58) Field of Classification Search ............... 438/149, 438/151, 197, 199, 584, 99, 479, 780, FOR. 135; 977/742, 642, 786, 787, 789; 257/E51.04, 257/E21.005, E21.051, E21.299
See application file for complete search history.

(56) References Cited

U.S. PATENT DOCUMENTS

| | | | |
|---|---|---|---|
| 5,894,136 A * | 4/1999 | Wook ............... | 257/59 |
| 6,599,631 B2 * | 7/2003 | Kambe et al. ............... | 428/447 |
| 2003/0111333 A1 * | 6/2003 | Montgomery et al. ....... | 204/164 |
| 2004/0241896 A1 * | 12/2004 | Zhou et al. ............... | 438/48 |
| 2004/0266063 A1 * | 12/2004 | Montgomery et al. ....... | 438/119 |
| 2005/0079659 A1 * | 4/2005 | Duan et al. ............... | 438/197 |

* cited by examiner

*Primary Examiner*—Matthew S Smith
*Assistant Examiner*—Quovaunda Jefferson
(74) *Attorney, Agent, or Firm*—Brinks Hofer Gilson & Lione

(57) ABSTRACT

A method for arraying nano material includes preparing a substrate coated with a dispersion solution where nano materials are dispersed and arraying the nano materials in the dispersion solution, in a uniform direction using a charged body.

2 Claims, 8 Drawing Sheets

METHOD FOR ARRAYING NANO MATERIAL AND METHOD FOR FABRICATING LIQUID CRYSTAL DISPLAY DEVICE USING THE SAME

PRIORY CLAIM

This application claims benefit of priority to Korean Patent Application No. P2005-069622, filed Jun. 29, 2005, the disclosure of which is hereby incorporated by reference.

BACKGROUND OF THE INVENTION

1. Technical Field

The present invention relates to a method for arraying nano material, and more particularly, to a method for arraying nano material in a uniform direction, and to a method for fabricating a liquid crystal display device using the same.

2. Description of the Related Art

With the rapid development of information communication technology, requirements on display devices are increasing. To meet the requirements, display devices having thin film transistors (TFTs) have been introduced which can provide excellent characteristics in views of resolution and implementation of moving picture. The TFTs can reduce power consumption of the display devices and are also advantageous to fabricate large-sized display devices.

A method of forming a related art TFT will now be described in detail with reference to the accompanying drawings.

FIGS. 1A and 1B are schematic views of a related art TFT. Specifically, FIG. 1A is a plan view of the related art TFT and FIG. 1B is a sectional view taken along line I-I' of FIG. 1A.

Referring to FIGS. 1A and 1B, a substrate 10 is prepared. A conductive material is deposited on the substrate 10 and is then patterned to form a gate electrode 20. A gate insulating layer 30 is formed on an entire surface of the substrate 10 where the gate electrode 20 is formed. A semiconductor layer 40 is formed on the gate insulating layer 30 corresponding to the gate electrode 20. A metal layer is deposited on the semiconductor layer 40 and is then patterned to form source/drain electrodes 50a and 50b. Consequently, the TFT is formed through these procedures.

The semiconductor layer 40 may be an inorganic semiconductor layer or an organic semiconductor layer. The inorganic semiconductor layer may be formed of amorphous silicon (a-Si) or polysilicon (p-Si). For example, as illustrated in FIGS. 1A and 1B, the inorganic semiconductor layer may include an active layer 40a and an ohmic contact layer 40b formed by sequentially depositing and patterning amorphous silicon and P-type or N-type doped amorphous silicon. Also, the organic semiconductor layer may be formed of polysilicon that is made by crystallizing amorphous silicon.

In forming the inorganic semiconductor layer, it is necessary to form a thin film using an expensive deposition apparatus and perform an etching process, resulting in the increase of the manufacturing cost. Specifically, if the inorganic semiconductor layer is formed of the polysilicon having higher carrier mobility than that of the amorphous silicon, device characteristics can be improved. In this case, however, since the crystallization process is performed at a high temperature, a lot of problems may be caused. In addition, high technology is required to form a uniform polysilicon layer. Therefore, there is a great difficulty in forming the inorganic semiconductor layer 40.

On the contrary, the organic semiconductor layer can be easily formed and also used in flexible display devices. The organic semiconductor layer, however, has lower carrier mobility than that of the inorganic semiconductor layer. Therefore, if an on-current level is increased, the size of the TFT is also increased. If the size of the TFT in the display device is increased, a region occupied by the pixel electrode in the unit pixel is reduced. Consequently, an aperture ratio is reduced and a cost is increased.

To solve these problems, display devices using nano transistors have been introduced.

The nano transistor includes an active layer and source/drain electrodes. The active layer is formed of nano material such as nanowire and nanotube, and the source/drain electrodes are arranged spaced apart from each other on the active layer. The active layer can be easily formed using a wet etching process, instead of a deposition process. Also, device characteristics are excellent because of the use of nano material.

It is preferable that the nano material should be arranged in a uniform direction. In this case, the carrier mobility of the active layer formed of the nano material can be increased. Also, in forming a plurality of nano transistors at the same time, the respective nano transistors may be formed to have the same characteristics. Also, in the display devices using the nano transistors, it is possible to secure uniform electrical characteristics of the nano transistors, thereby obtaining uniform image quality of the display devices.

One of methods for arraying the nano material in a uniform direction is a Langmuir-Blodgett method. According to the Langmuir-Blodgett method, a substrate where a self assembly monolayer is formed is soaked in a solution where nano material is dispersed, and the nano material is adsorbed on the substrate. However, the Langmuir-Blodgett method is not suitable for mass production and its stabilization is degraded.

According to another method, trenches having a uniform direction are formed on a substrate, where nano material will be formed, and nano material is then inserted into the trenches. However, this method is difficult to form nano-sized trenches. Also, it is difficult to insert nano material into the nano-sized trenches, causing device failure.

SUMMARY

Accordingly, the present invention is directed to a method for arraying nano material, and to a method for fabricating a liquid crystal display device using the same that substantially obviate one or more problems due to limitations and disadvantages of the related art.

In accordance with one aspect of the invention, as embodied and broadly described herein, there is provided a method for arraying nano materials that includes coating a substrate with a dispersion solution in which nano materials are dispersed and arraying the nano materials in a uniform direction using a charged conductive body.

In a further aspect of the present invention, there is provided a method for fabricating a liquid crystal display device that includes preparing a substrate having a gate line formed thereon. A gate insulating layer is formed on the gate line and a surface treatment is performed to divide the gate insulating layer into a hydrophilic region and a hydrophobic region. A dispersion solution, in which nano materials are dispersed, is applied onto the hydrophilic region. The nano materials are arrayed in a uniform direction using a charged body. The substrate is thermally treated to fix the nano materials to the gate insulating layer, and thereby forming a semiconductor layer. Source and drain electrodes, which are spaced apart from each other, are formed on the semiconductor layer and a passivation layer is formed on an entire surface of the substrate including the source and drain electrodes. The passivation layer has a contact hole exposing a portion of the drain electrode. A pixel electrode is formed that electrically connects to the drain electrode through the contact hole.

In another aspect of the invention, a method for fabricating a conductive layer of an liquid crystal display device includes providing a substrate and performing a surface treatment to form a hydrophilic region. A dispersion solution is applied in which nano materials are dispersed and the nano materials are arrayed in a uniform direction using a charged body. The substrate is thermally treated to fix the nano materials to the substrate to form the conductive layer.

It is to be understood that both the foregoing general description and the following detailed description of the present invention are exemplary and explanatory and are intended to provide further explanation of the invention as claimed.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 1A:
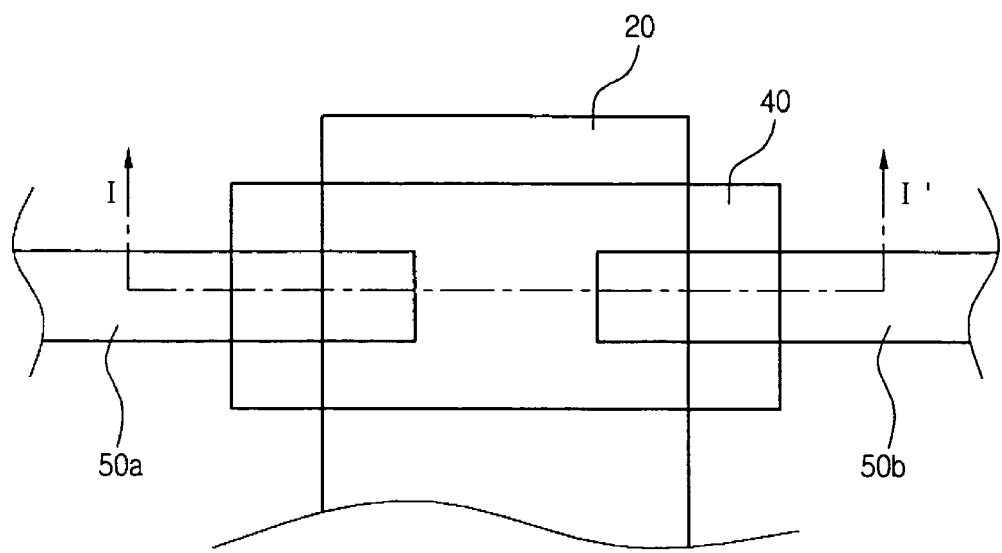
FIGS. 1A and 1B are schematic views of a related art TFT.
Figure 1B:
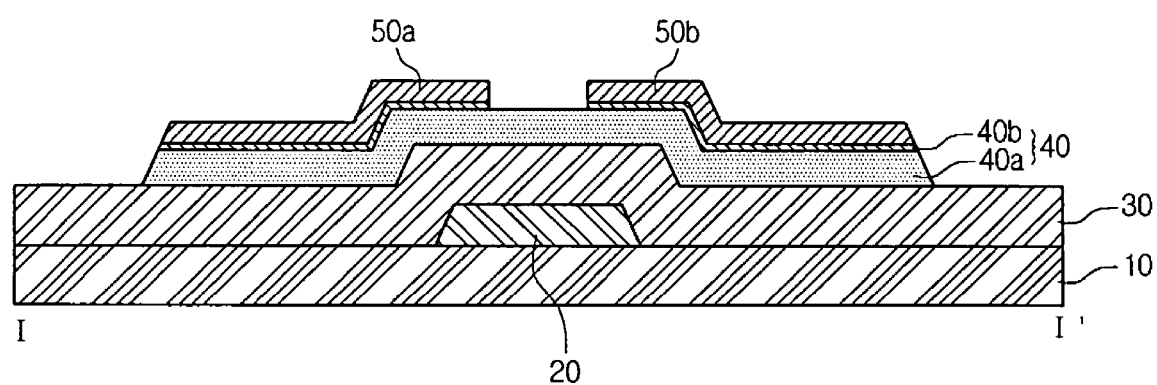
Figure 2A:
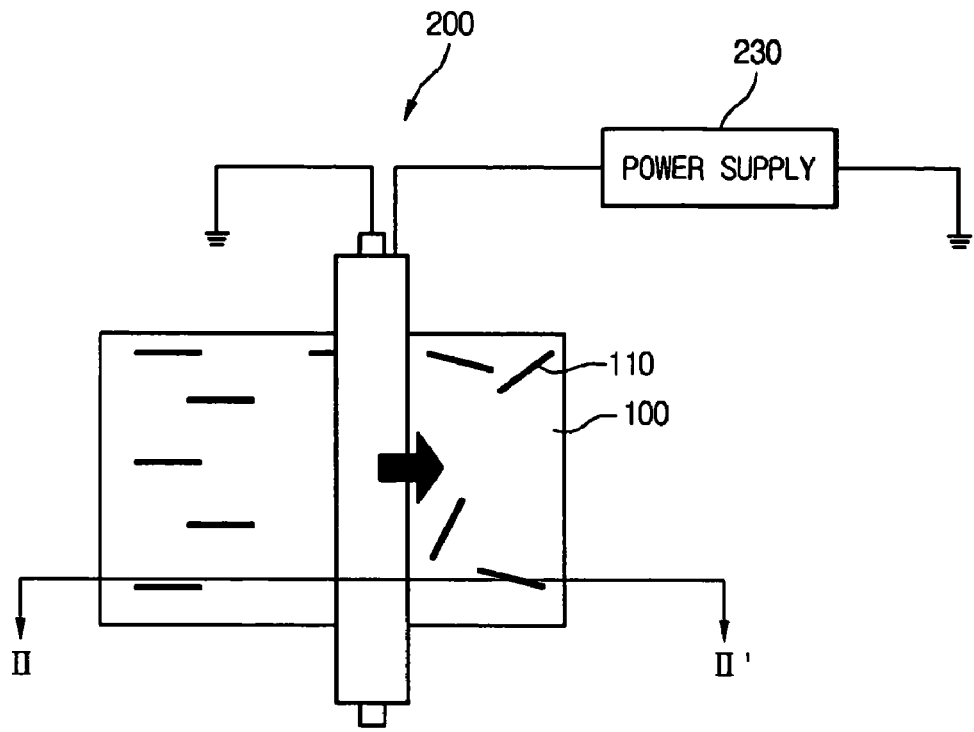
FIGS. 2A to 2C are views for explaining an apparatus and method for arraying nano material according to a first embodiment of the present invention.
Figure 2B:
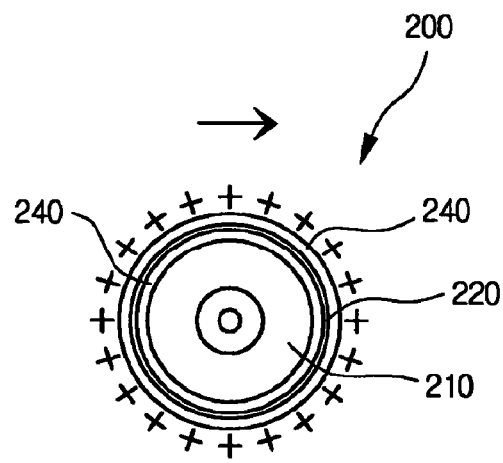
Figure 2B:
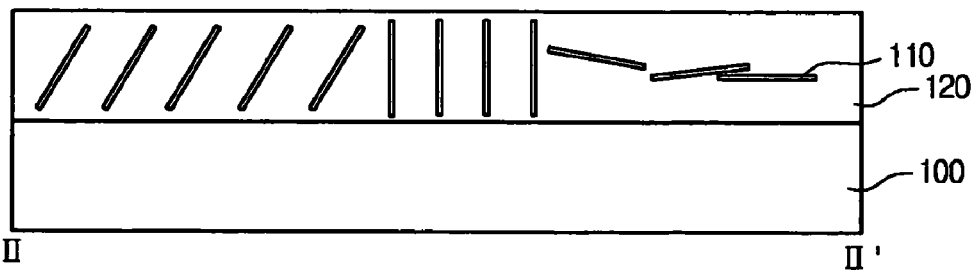

FIGS. 2A and 2B are views for explaining an apparatus and method for arraying nano material according to a first embodiment of the present invention. Specifically, FIG. 2A is a plan view illustrating a process of arraying nano material and FIGS. 2B and 2C are sectional views taken along line II-II' of FIG. 2A.

Figure 2C:
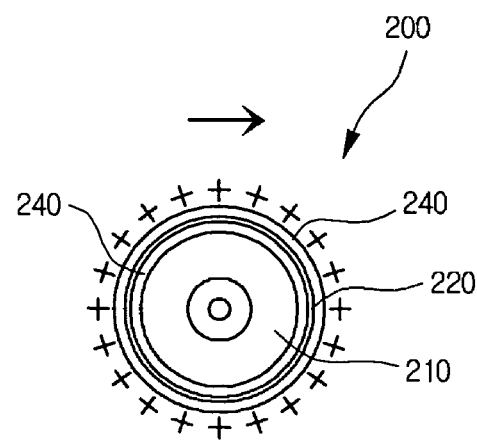
Figure 2C:
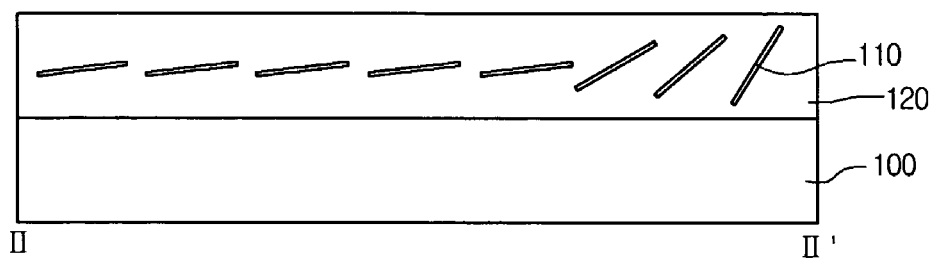

Referring to FIGS. 2A to 2C, a dispersion solution 120 where nano materials 100 are dispersed is coated on a substrate 100 by a typical method. Examples of the typical method include an inkjet printing, a spin coating, a deep coating, and a doctor blade. However, the present invention is not limited to these methods.

The nano materials 110 dispersed in the dispersion solution 120 are arrayed in a random direction. The nano materials 110 may be nanowires or nanotubes. Also, the nano materials 110 can be a dielectric material and, more particularly, may be at least one material selected from the group consisting of Si, Ge, Sn, Se, Te, B, C, P, GaN, ZnO, $SiO_2$, and $Al_2O_3$.

Also, the dispersion solution 120 may include a hydrophilic solvent and further include polymer and dispersant. The hydrophilic solvent 120 disperses the nano materials 110 such that the substrate 110 is uniformly coated with it. The polymer makes the nano materials 110 attached to the substrate 100 or prevents the nano materials 110 from moving along a charged body within the dispersion solution during an align process. The dispersant stably disperses the nano materials 110, thereby preventing the nano materials 110 from being agglomerated.

In order to form the nano materials 110 in a predetermined region, a surface treatment may be further performed on the substrate 100. The surface treatment is a process of dividing the substrate 100 into a hydrophilic region and a hydrophobic region. The nano materials 110 dispersed in the hydrophilic solvent may be formed in the hydrophilic region.

Then, the apparatus 200 for arraying the nano material is moved while contacting the surface of the dispersion solution 120 or being spaced apart therefrom by a predetermined distance. At this point, it is preferable that the apparatus 200 should be charged.

The apparatus 200 of the present invention includes a circular support 210, a conductive substrate 220 arranged on the support 210, a power supply 230 electrically connected to the conductive substrate 220, and insulators 240 arranged at the inner and outer sides of the conductive substrate 220. Although the apparatus 200 may have a roller shape as shown in FIG. 2B, the present invention is not limited to this shape. That is, the apparatus 200 may have a flat panel shape or other shapes.

In further detail, the support 210 supports and fixes the conductive substrate 220 and the insulators 240. The support 210 may further include a moving element (not shown) to freely move the apparatus 200.

The conductive substrate 220 may be a metal substrate. As shown in FIG. 2, the conductive substrate 220 may surround the support 210 and may be disposed on at least the support 210.

The insulators 240 may be formed of hydrophobic material, such as polydimethylsiloxane (PDMS). In this case, it is possible to prevent the dispersion solution 120 from being attached to the surface of the apparatus 200 due to a surface capillary phenomenon that may occur when the apparatus 200 passes through or over the surface of the dispersion solution 120 coated on the substrate 100. Therefore, the nano materials 110 temporarily fixed to the substrate 100 can be prevented from escaping from a region intended to be formed by the apparatus 200. Also, the nano materials 110 can be arrayed more efficiently due to a micro-laminar flow, which is generated by the repulsive force of the hydrophobic insulators.

The power supply 230 supplies power to the conductive substrate 220, so that the apparatus 200 is charged. Therefore, due to an electric field generated by the supplied power, the nano materials 110 can be arrayed on the substrate 100 in a uniform direction.

Since the method of charging the nano material arraying apparatus 200 is not limited specially, the apparatus can be charged using an electrostatic induction method generally used or an electrostatic induction method using friction. At this point, the ground with the power supply 230 may be used.

The charged apparatus 200 moves along an upper portion of the substrate 100 in a predetermined direction. At this point, nano materials 110 dispersed within the dispersion solution 120 rotates in a direction of the charged apparatus 200. That is, the nano materials 110 are erected in a region where the apparatus 200 is placed. On the contrary, in a region where the apparatus 200 is not placed, the nano materials 110 are inclined in a direction of the apparatus 200.

Therefore, it can be seen from FIGS. 2B and 2C that the nano materials 110 are horizontally inclined in a direction in which the apparatus 200 moves.

At this point, the nano materials 110 rotate in a direction, in which an electric field is formed, without adjusting viscosity or moving in the dispersion solution 120 according to characteristics of the polymer.

Also, it is advantageous that the nano materials 110 have dipole characteristics in which both sides are charged with positive charge and negative charge, respectively.

Thereafter, by performing a thermal treatment on the substrate 100 through which the apparatus 200 has passed, the nano materials 110 can be fixed to the substrate 100, while removing the hydrophilic solvent, the polymer, and the dispersant, except the nano materials 100.

Consequently, the nano materials 110 can be arrayed on the substrate 100 in a constant direction.

According to the present invention, since the nano materials 110 can be arrayed in a constant direction, the present invention can be applied to various fields, such as lines, transistors, diodes, nano sensors, and semiconductor devices, which have excellent electrical conductivity and uniform characteristic.

Figure 3A:
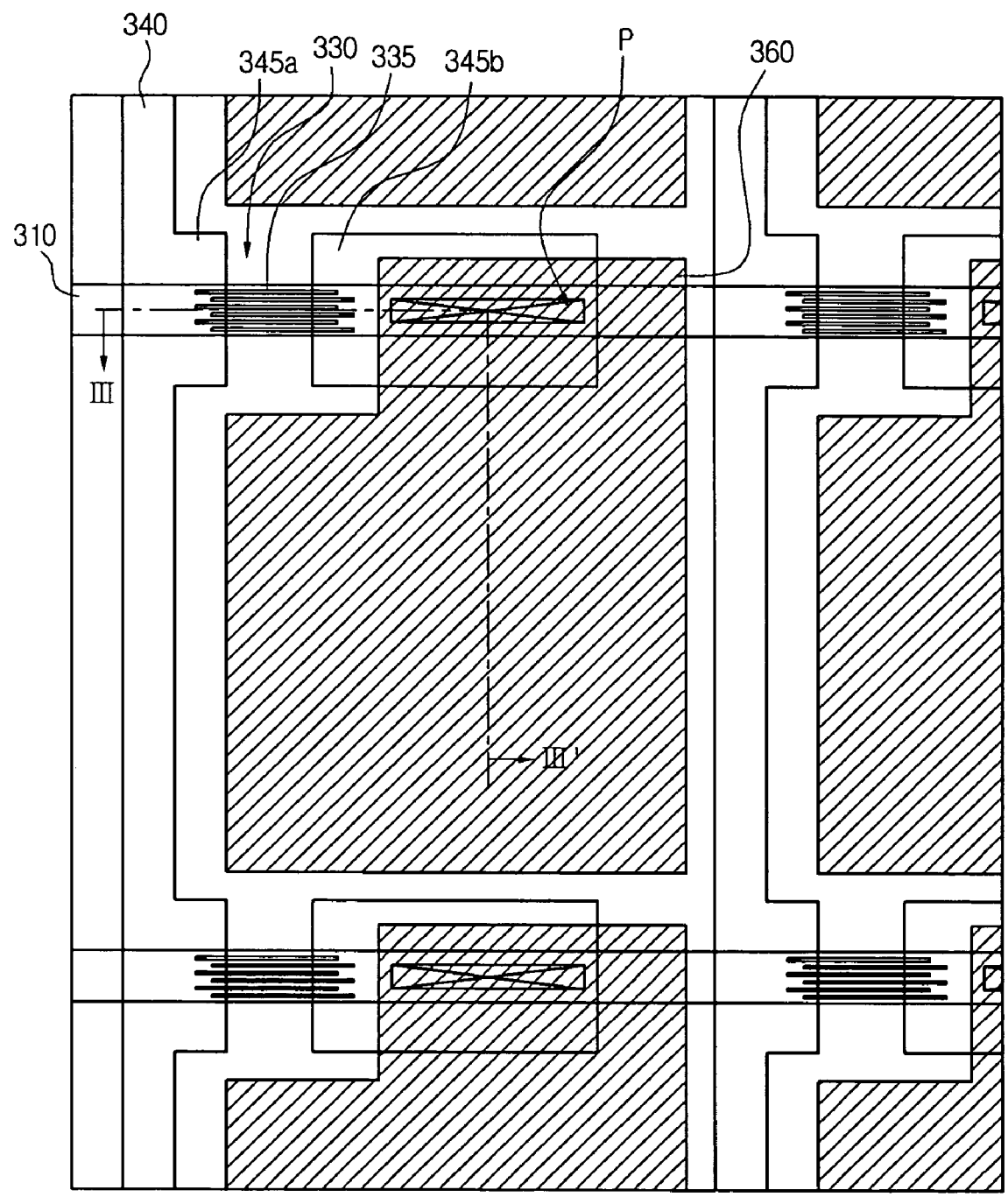
FIGS. 3A and 3B are views for explaining a method for fabricating an LCD according to another embodiment of the present invention.
Figure 3B:
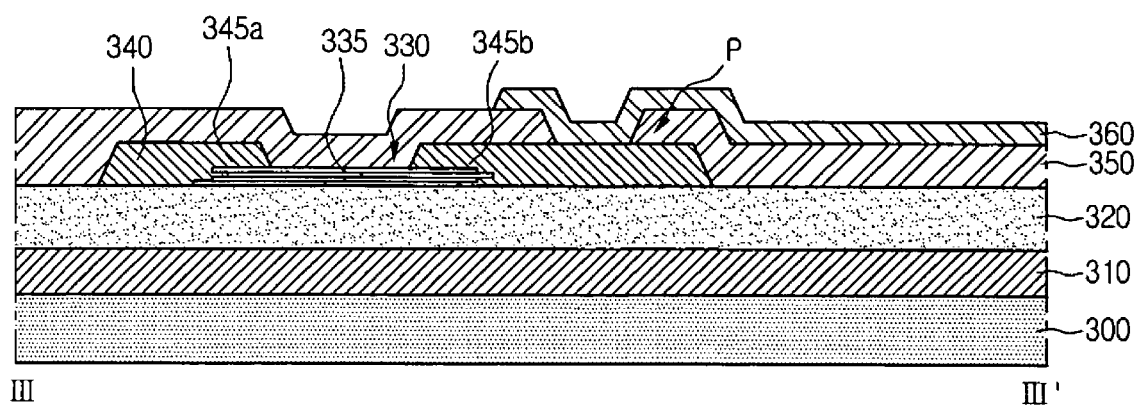

FIGS. 3A and 3B are views for explaining a method for fabricating an LCD according to a second embodiment of the present invention. Specifically, FIG. 3A is a plan view of a bottom substrate in the LCD and FIG. 3B is a sectional view taken along line III-III' of FIG. 3A.

Referring to FIGS. 3A and 3B, a gate line 310 through which a gate signal is supplied is formed on a substrate 300. A gate insulating layer 320 is formed on an entire surface of the substrate 300 where the gate line 310 is formed. A data line 340 intersecting with the gate line 310 is formed on the gate insulating layer 320. In this case, a nano transistor is formed in an intersection region of the gate line 310 and the data line 340.

Since the nano transistor is smaller than an amorphous TFT or polysilicon TFT, it prevents a transmitted light or reflected light from being shielded, thereby improving the aperture ratio of the LCD. Also, even if the LCD includes complicated circuits, the pixel region is not reduced.

The nano transistor includes a semiconductor layer 330 formed of nano materials 335 at the gate insulating layer 320 corresponding to the gate line 310, which intersects with the data line 340, and a source electrode 345a and a drain electrode 345b spaced apart from each other on the semiconductor layer 330. The source electrode 345a is connected to the data line 340 and the drain electrode 345b is connected to the pixel electrode 360. It is preferable that the nano materials 335 of the semiconductor layer 330 should be arrayed in a uniform direction. By doing so, the control of the respective unit pixels is easy and the uniform electrical characteristic can be obtained.

The nano materials 335 may be nanotubes or nanowires. The nano materials 335 may also be selected from the group consisting of Si, Ge, Sn, Se, Te, B, C, P, GaN, ZnO, $SiO_2$, and $Al_2O_3$.

A passivation layer 350 is formed on an entire surface of the substrate 300 where the nano transistor is formed. The passivation layer 350 may be formed of silicon oxide, silicon nitride, or a stacked layer thereof. A portion of the passivation layer 350 is etched to form a contact hole P exposing a portion of the drain electrode 345b. A transparent conductive layer is deposited and patterned to form a pixel electrode 360. The pixel electrode 360 is electrically connected to the drain electrode 345b through the contact hole P.

Although not shown, a top substrate including a color filter and a common electrode fabricated using a typical method is provided. Then, the top substrate is attached to the substrate where the nano transistors are formed, and liquid crystal is injected between the two substrates. The LCD is fabricated through these procedures.

A method for fabricating the LCD with the nano transistors according to the present invention will be described below in more detail with reference to FIGS. 3A and 3B, and 4A to 4C.

Figure 4A:
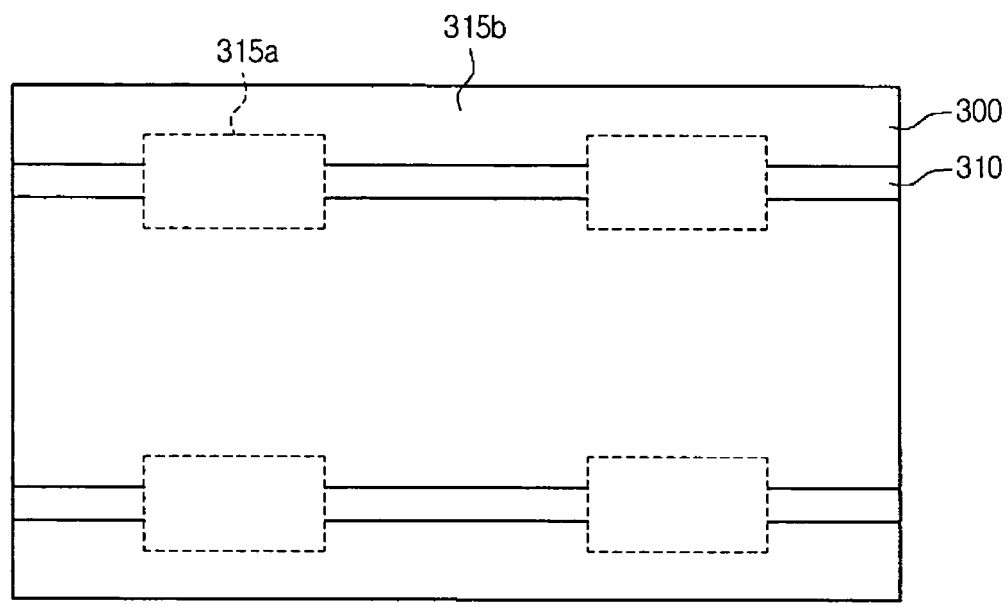
FIGS. 4A to 4C are plan views for explaining the method for fabricating the LCD in detail according to yet another embodiment of the present invention.
Figure 4B:
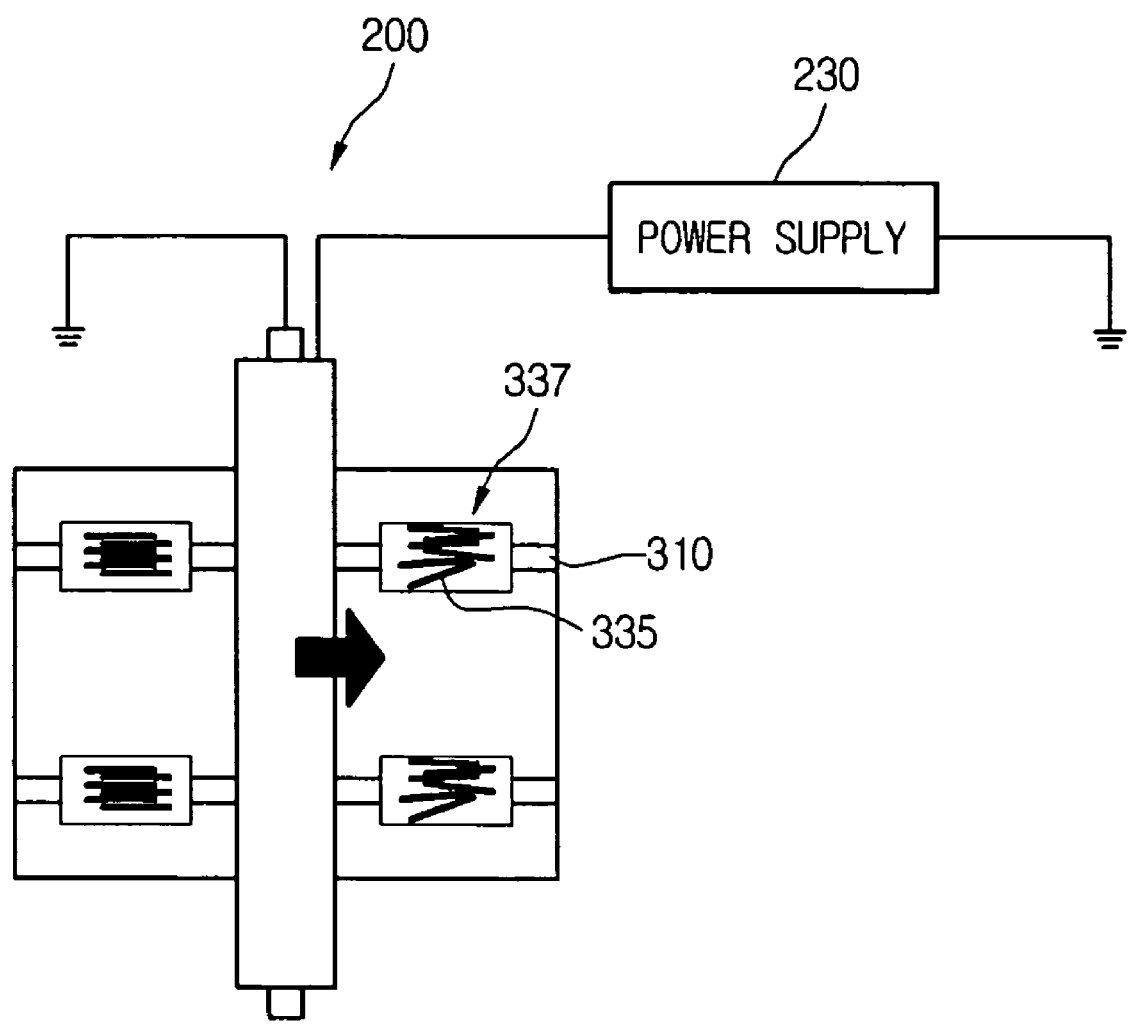
Figure 4C:
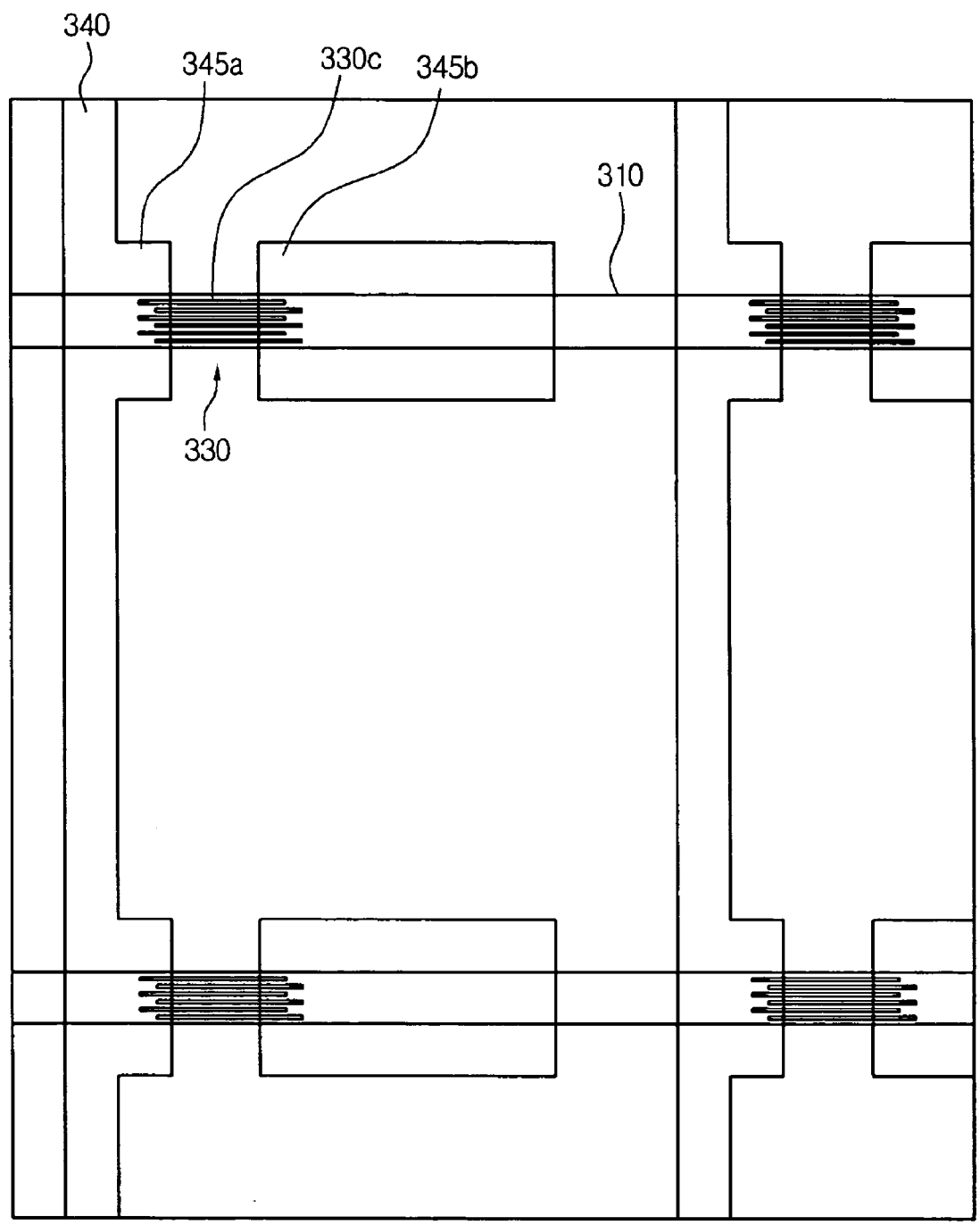

FIGS. 4A to 4C are plan views for explaining the method for fabricating the LCD according to the second embodiment of the present invention.

Referring to FIGS. 4A and 3B, a substrate 300 is prepared. A conductive layer is deposited on the substrate 300 and patterned to form a gate line 310. A gate insulating layer 320 is formed on an entire surface of the substrate 300 where the gate line 310 is formed. The gate insulating layer 320 may be formed of silicon oxide, silicon nitride, or a stacked layer thereof.

Then, a surface treatment is performed on the gate insulating layer 320. Through the surface treatment, the gate insulating layer 320 is divided into a hydrophilic region 315a and a hydrophobic region 315b.

Specifically, a solution containing hydrophilic organic molecules is coated on the gate insulating layer 320 by a typical coating method and is then patterned to form the hydrophilic region 315a. Also, a solution containing hydrophobic organic molecules is coated on the gate insulating layer 320 and is then patterned to form the hydrophobic region 315b. That is, by coating the solution containing the hydrophilic or hydrophobic organic molecules on the gate insulating layer 320 and patterning the coated solution, the gate insulating layer 320 can be divided into the hydrophilic region 315a and the hydrophobic region 315b.

At this point, the hydrophilic region 315a is a region corresponding to a predetermined portion of the gate line 310 and the predetermined portion may be an intersection region of the gate line 310 and the data line that will be formed later.

Referring to FIG. 4B, a dispersion solution 337 where the nano materials 335 are dispersed is coated on the gate insulating layer 320 by a typical method. Examples of the typical method include an inkjet printing, a spin coating, a deep coating, and a doctor blade. More preferably, the dispersion solution 337 is locally dropped in the hydrophilic region (315a in FIG. 4A) using the inkjet printing.

The nano materials 335 may be nanowires or nanotubes. Also, the nano materials 335 may be at least one material selected from the group consisting of Si, Ge, Sn, Se, Te, B, C, P, GaN, ZnO, $SiO_2$, and $Al_2O_3$. Also, the dispersion solution 337 may include a hydrophilic solvent, polymer and dispersant, in addition to the nano materials 335.

Then, the apparatus 200 moves on the substrate 300. At this point, it is preferable that the apparatus 200 should be charged.

The apparatus 200 is moved on or above the surface of the dispersion solution 337.

Therefore, due to an electric field generated by the charged apparatus 200, the nano materials 335 can be arrayed in a uniform direction.

Referring to FIG. 4C, by performing a thermal treatment on the substrate 330, the nano materials 335 can be fixed to the substrate 300, while removing the hydrophilic solvent, the polymer, and the dispersant, except the nano materials 335. Accordingly, it is possible to form the semiconductor layer 330 formed of the nano materials 335 arrayed in a uniform direction.

Then, by forming the source/drain electrodes 345a and 345b spaced apart from each other on the semiconductor layer 330, the nano transistor having excellent carrier mobility can be fabricated. Also, by forming a plurality of nano transistors on the substrate, the respective nano transistors can have uniform characteristics.

Referring to FIGS. 3A and 3B, a passivation layer 350 is formed on an entire surface of the substrate where the nano transistor is formed. The passivation layer 350 may be formed of silicon oxide, silicon nitride, or a stacked layer thereof. A portion of the passivation layer 350 is etched to form a contact hole P exposing a portion of the drain electrode 345b. A transparent conductive layer is deposited and patterned to form a pixel electrode 360. The pixel electrode 360 is electrically connected to the drain electrode 345b through the contact hole P.

In providing the nano transistor at each unit pixel, each nano transistor includes the semiconductor layer formed of the nano materials arrayed in a uniform direction, the control of each unit pixel becomes easy and the LCD can have uniform image picture.

Figure 5A:
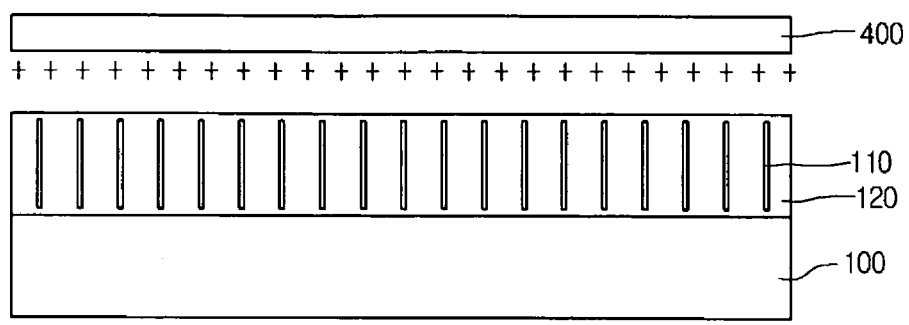
FIGS. 5A to 5C are views illustrating a method for arraying nano material according to a still further embodiment of the present invention.
Figure 5B:
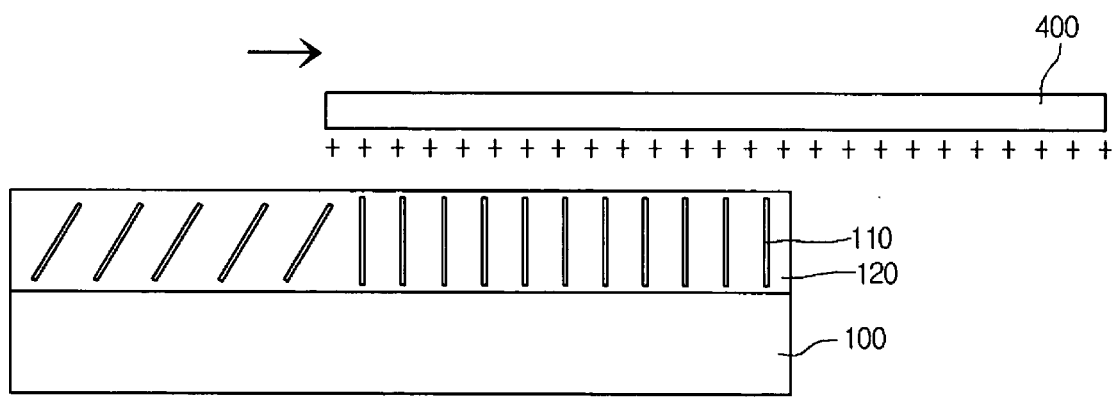
Figure 5C:
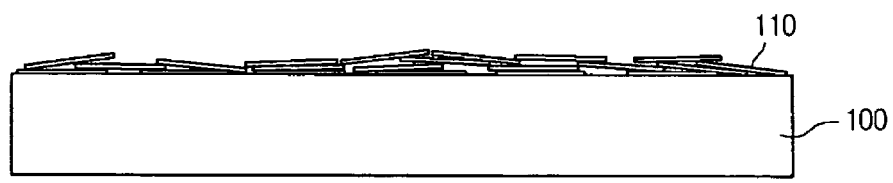

FIGS. 5A to 5C are views illustrating a method of arraying nano material according to a fourth embodiment of the present invention.

Referring to FIGS. 5A to 5C, when a dispersion solution 120 containing nano materials 110 is coated on a substrate 100, a charged body 400 is placed.

It is preferable that the nano materials should have dipole characteristics divided into positive polarity and negative polarity. The basic principle is identical to that in FIGS. 2A to 2C, which will be referred herein.

When the charged body 400 is placed on the substrate 100, all nano materials 110 contained in the dispersion solution are erected.

Thereafter, the charged body 400 is moved left or right by a predetermined distance along a direction parallel to a gate line. At this point, due to viscosity of the dispersion solution 120 or the polymer and a dispersant, the nano materials 110 are rotated without moving along an electric field of the charged body.

When the charged body 400 is brought in proximity to the dispersion solution, the nano materials 110 erected within the dispersion solution 120 are rotated to have a predetermined slope.

After the charged body 400 is removed, a thermal treatment is performed to remove the dispersion solution 120. By doing so, the nano materials 110 tilted at a predetermined slope fall down on the substrate 100 and then are aligned.

At this point, since the nano materials 110 are inclined in a direction of the gate line, all the nano materials fall down in a direction parallel to the gate line and then are aligned.

According to the present invention, since the nano materials are arrayed in a uniform direction, it is possible to form a plurality of transistors having uniform characteristics.

Also, the present invention is advantageous to mass production and the semiconductor layer can be formed using the wet etching process, which does not require an expensive deposition apparatus. Consequently, the productivity can be improved, while reducing the manufacturing cost.

In addition, since the semiconductor layer can be formed of nano materials arrayed in a uniform direction, the LCD can be easily controlled and provide uniform image quality.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a liquid crystal display device comprising:
    preparing a substrate having a gate line thereon;
    forming a gate insulating layer on the gate line;
    performing a surface treatment to divide the gate insulating layer into a hydrophilic region and a hydrophobic region;
    dropping a dispersion solution, in which nano materials are dispersed, onto the hydrophilic region;
    arraying the nano materials in a uniform direction using a array apparatus including a charged body;
    thermally treating the substrate to fix the nano materials to the gate insulating layer, thereby forming a semiconductor layer;
    forming source and drain electrodes spaced apart from each other on the semiconductor layer;
    forming a passivation layer on an entire surface of the substrate including the source and drain electrodes, the passivation layer having a contact hole exposing a portion of the drain electrode; and
    forming a pixel electrode electrically connected to the drain electrode through the contact hole,
    wherein arraying the nano materials comprise the nano materials shift the nano materials to a substantially upright position relative to the substrate in response to the electric field and align by rotating in the direction of movement of the charged conductive body,
    wherein the dispersion solution further including a polymer preventing the nano materials from moving along the charged conductive body, a hydrophilic solvent and a dispersant dispersing the nano materials on the substrate,
    wherein the array apparatus further including a circular support supporting and providing the charged conductive body,
    wherein the nano materials comprise at least one material selected from the group consisting of Si, Ge, Se, Te, B, C, P, GaN, ZnO, $SiO_2$, or $Al_2O_3$.

2. The method according to claim 1, wherein the hydrophilic region comprises a region corresponding to a portion of the gate line.

* * * * *